United States Patent [19]
Yu

[11] Patent Number: 5,715,127
[45] Date of Patent: Feb. 3, 1998

[54] METHOD FOR PREVENTING ELECTROSTATIC DISCHARGE FAILURE IN AN INTEGRATED CIRCUIT PACKAGE

[75] Inventor: Ta-Lee Yu, Hsinchu, Taiwan

[73] Assignee: Winbond Electronics Corp., Hsinchu, Taiwan

[21] Appl. No.: 642,194

[22] Filed: May 6, 1996

[51] Int. Cl.⁶ .................................................. H02H 3/22
[52] U.S. Cl. .............................. 361/56; 361/111; 361/220
[58] Field of Search ............................ 361/56, 91, 111, 361/212, 220; 257/491

[56] References Cited

U.S. PATENT DOCUMENTS

| | | | |
|---|---|---|---|
| 4,819,047 | 4/1989 | Gilfeather et al. | 361/56 |
| 4,870,530 | 9/1989 | Hurst et al. | 361/91 |
| 4,878,145 | 10/1989 | Lace | 361/118 |
| 5,012,317 | 4/1991 | Rountre | 361/56 |
| 5,034,845 | 7/1991 | Murakami | 361/56 |
| 5,159,518 | 10/1992 | Roy | 361/56 |
| 5,515,225 | 5/1996 | Gens et al. | 361/56 |

*Primary Examiner*—Jeffrey A. Gaffin
*Assistant Examiner*—Michael Sherry
*Attorney, Agent, or Firm*—Fish & Richardson P.C.

[57] ABSTRACT

An integrated circuit package includes a semiconductor chip, bonding pads on the semiconductor chip, a metal lead frame contacting electrically with the semiconductor chip, a plurality of wired pins wire-bonded respectively to the bonding pads, and at least one non-wired pin. The non-wired pin is wire-bonded to the metal lead frame to prevent electrostatic discharge failure of the integrated circuit package due to electrostatic discharge stressing of the non-wired pin.

13 Claims, 4 Drawing Sheets

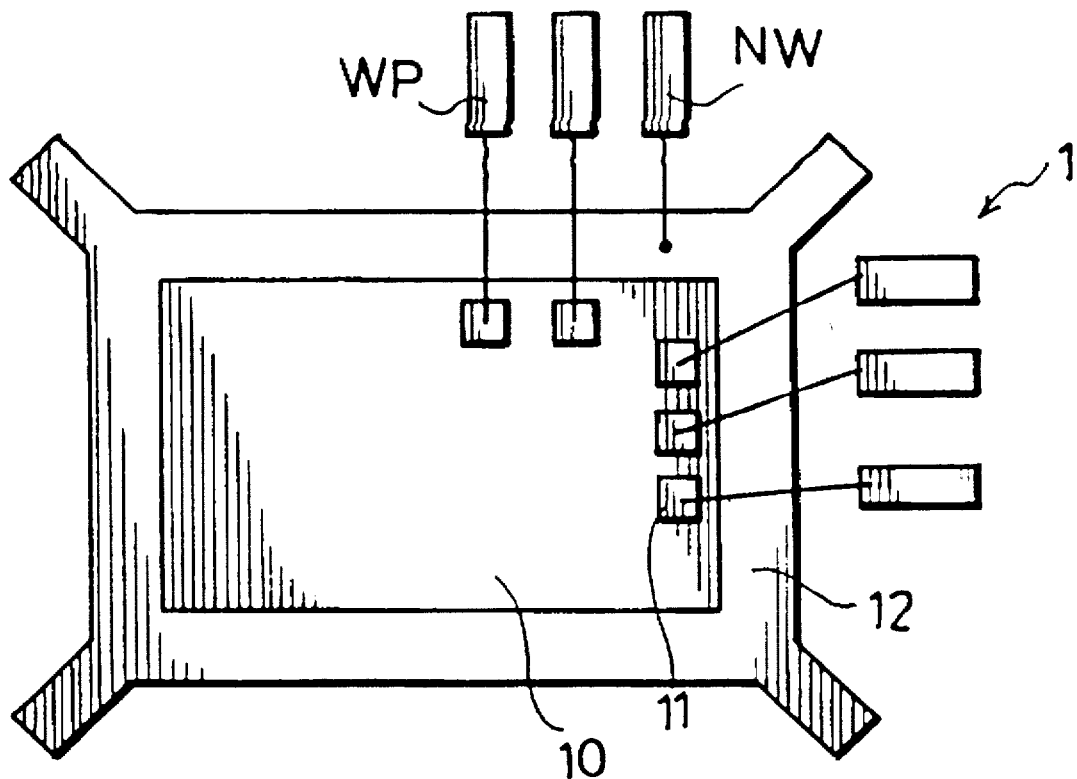
F I G. 1

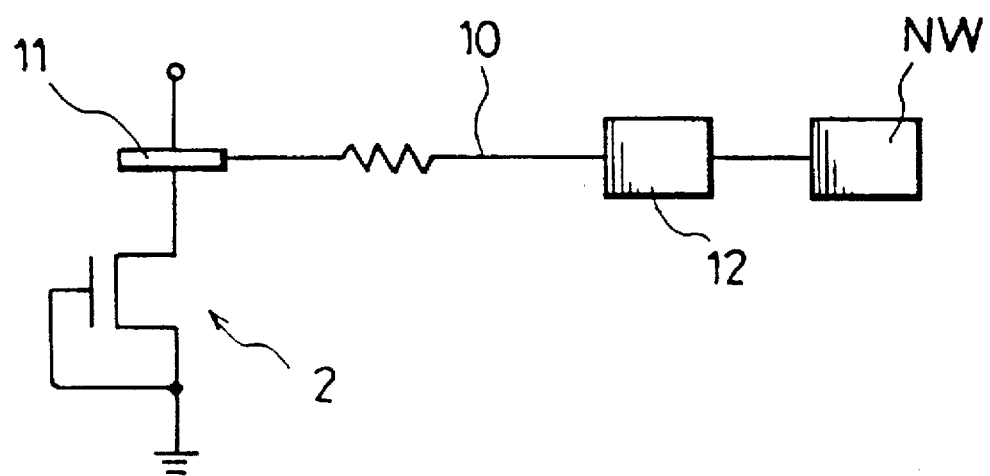
F I G. 2
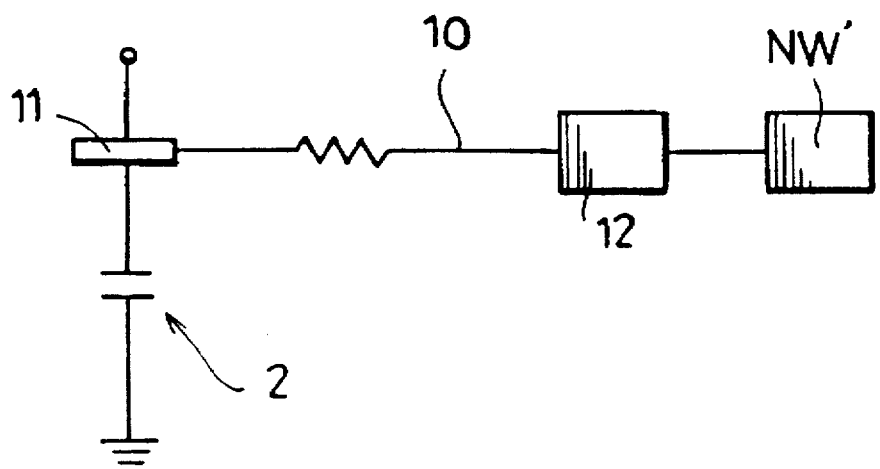
F I G. 3

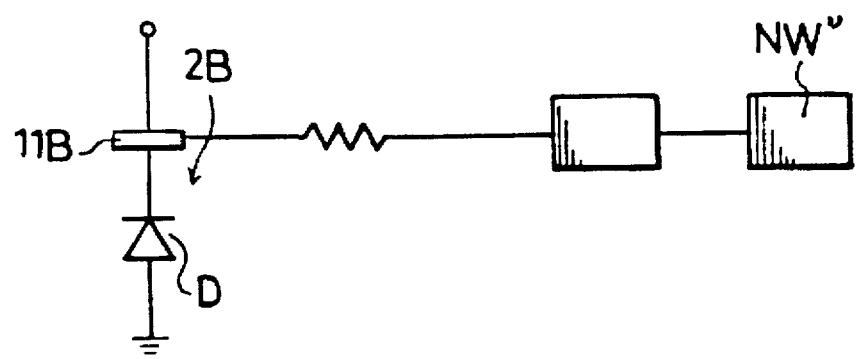
F I G. 4
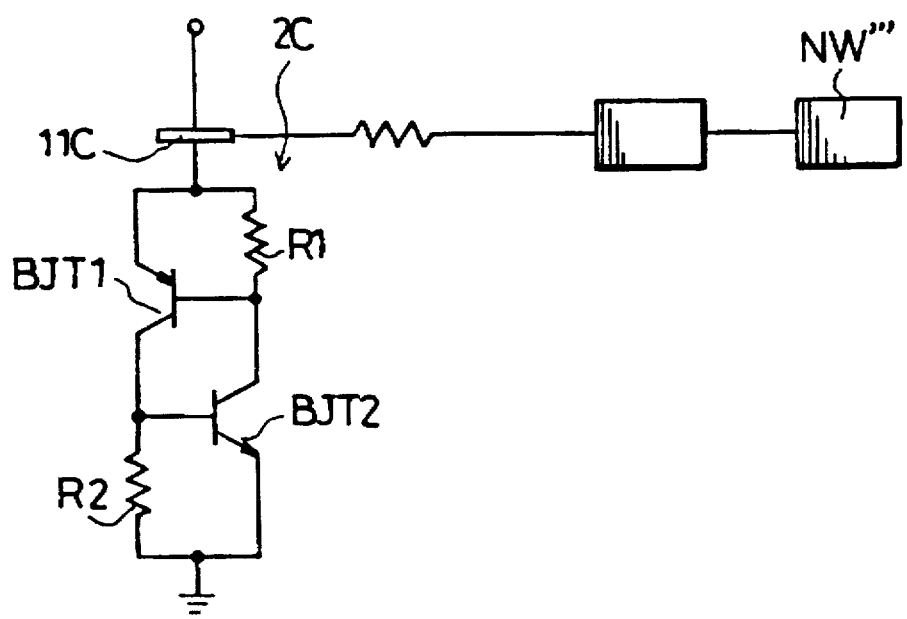
F I G. 5

METHOD FOR PREVENTING ELECTROSTATIC DISCHARGE FAILURE IN AN INTEGRATED CIRCUIT PACKAGE

CROSS REFERENCE TO RELATED APPLICATIONS

U.S. Ser. No. 08/643,355, entitled "Method for Preventing Electrostatic Discharge Failure in an Integrated Circuit Package" filed May 6, 1996.

BACKGROUND OF THE INVENTION

1. Field of the Invention

This invention relates to an integrated circuit, more particularly to a method for preventing electrostatic discharge failure in an integrated circuit package.

2. Description of the Related Art

The trend of very large-scale integrated (VLSI) circuit packages is toward smaller dimension and higher density. Also, VLSI circuit packages make rapid progress to high pin counts and narrow pin pitch with increasing input/output signals by the trend of higher integrated function. With the increasing of pin count, the possibility of suffer from electrostatic discharge (ESD) failure, which is due to electrostatic discharge stressing of the non-wired pin of the integrated circuit package, is increasing. Therefore, the ESD is considered a major reliability threat to integrated circuit technologies. However, little attention has been paid to the destruction mechanism of non-wired pin so far. Thus, there is a need to provide a method which can prevent electrostatic discharge failure in an integrated circuit package.

SUMMARY OF THE INVENTION

The main objective of the present invention is to provide a method for preventing electrostatic discharge failure in an integrated circuit package.

According to the present invention, a method is provided for preventing electrostatic discharge failure in an integrated circuit package. The integrated circuit package includes a semiconductor chip, bonding pads on the semiconductor chip, a metal lead frame contacting electrically with the semiconductor chip, a plurality of wired pins wire-bonded respectively to the bonding pads, and at least one non-wired pin. The electrostatic discharge failure is due to electrostatic discharge stressing of the non-wired pin. The method comprises the step of wire-bonding the non-wired pin to the metal lead frame.

BRIEF DESCRIPTION OF THE DRAWINGS

Other features and advantages of the present invention will become apparent in the following detailed description of the preferred embodiments, with reference to the accompanying drawings, of which:

FIG. 1 is a schematic plan view illustrating the connection between a metal lead frame and a non-wired pin of an integrated circuit package in accordance with the present invention;

FIG. 2 is a schematic circuit diagram illustrating one type of power-supply electrostatic discharge protection device connected to the non-wired pin of the integrated circuit package which has a semiconductor chip having an N-substrate;

FIG. 3 is a schematic circuit diagram illustrating another type of power-supply electrostatic discharge protection device connected to the non-wired pin of the integrated circuit package of FIG. 2;

FIG. 4 is a schematic circuit diagram illustrating another type of power-supply electrostatic discharge protection device connected to the non-wired pin of the integrated circuit package of FIG. 2;

FIG. 5 is a schematic circuit diagram illustrating another type of power-supply electrostatic discharge protection device connected to the non-wired pin of the integrated circuit package of FIG. 2;

DETAILED DESCRIPTION OF THE PREFERRED EMBODIMENTS

Figure 6:
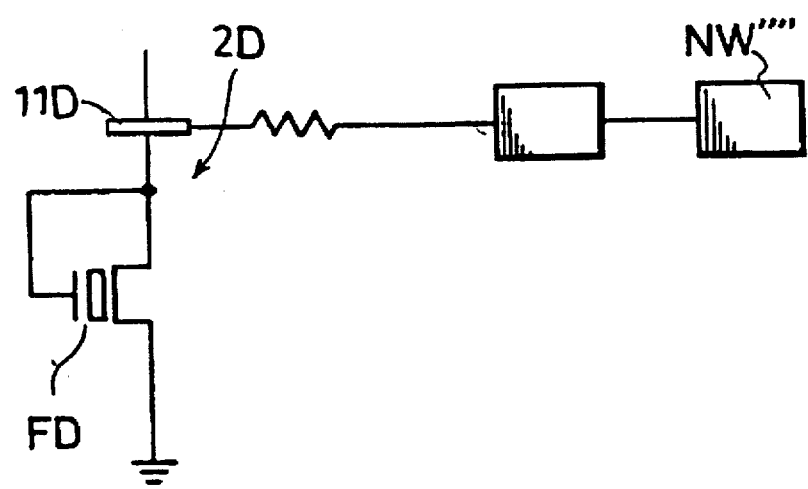
FIG. 6 is a schematic circuit diagram illustrating another type of power-supply electrostatic discharge protection device connected to the non-wired pin of the integrated circuit package of FIG. 2.

FIG. 1 shows an integrated circuit package 1 which includes a semiconductor chip 10, bonding pads 11 on the semiconductor chip 10, a metal lead frame 12 contacting electrically with the semiconductor chip 10, a plurality of wired pins (WP) wire-bonded respectively to the bonding pads 11, and at least one non-wired pin (NW).

In the method of the present invention, the non-wired pin (NW) is wire-bonded to the metal lead frame 12. As best shown in FIG. 2, the metal lead frame 12 is connected electrically to one of the bonding pads 11 which is adapted to be connected electrically to a first power source via the semiconductor chip 10. It should be noted that, in the present embodiment, the semiconductor chip 10 has an N-substrate with an inherent resistance of about $5\Omega$, and the first power source is a positive power source. A power-supply electrostatic-discharge protection device 2 is connected electrically to said one of the bonding pads 11 for discharging of current that results from electrostatic discharge stressing of the non-wired pin. The protection device 2 includes a field effect transistor (T) which has a drain connected electrically to said one of the bonding pads 11, a source adapted to be connected electrically to a second power source and a gate connected electrically to the source thereof. In the present embodiment, the second power source is grounded. Since the current that results from electrostatic discharge stressing of the non-wired pin (NW) is discharged through the protection device 2, destruction of the adjacent wired pin (WP) that is adjacent to the non-wired pin (NW) and that is caused by the ESD stressing to the non-wired pin (NW) is thus prevented.

FIG. 3 shows the relationship between another type of power-supply electrostatic discharge protection device (2A) and the non-wired pin (NW') of the integrated circuit package. The power-supply electrostatic discharge protection device (2A) of FIG. 3 includes a capacitor (C) which may be a build-in capacitor or an externally-connected capacitor. The capacitor (C) has a first terminal connected electrically to one of the bonding pads (11A) that is adapted to be connected electrically to a first power source, and a second terminal adapted to be connected electrically to a second power source. In the present embodiment, the first power source is a positive power source, while the second power source is grounded. It should be appreciated that the capacitance of the capacitor (C) should be relatively large.

FIG. 4 shows the relationship between another type of power-supply electrostatic discharge protection device (2B) and the non-wired pin (NW") of the integrated circuit package. The power-supply electrostatic discharge protection device (2B) of FIG. 4 includes a diode (D) which has a cathode connected electrically to one of the bonding pads (11B) that is adapted to be connected electrically to a first power source, and an anode adapted to be connected electrically to a second power source. In the present embodiment, the first power source is a positive power source, while the second power source is grounded.

FIG. 5 shows the relationship between another type of power-supply electrostatic discharge protection device (2C) and the non-wired pin (NW''') of the integrated circuit package. The power-supply electrostatic discharge protection device (2C) of FIG. 5 includes a silicon-controlled-rectifier. The silicon-controlled-rectifier includes a first transistor (BJT1) having an emitter connected electrically to one of the bonding pads (11C) that is adapted to be connected electrically to a first power source, a base adapted to be connected electrically to said one of the bonding pads (11C) via a first resistor (R1), and a collector adapted to be connected electrically to a second power source via a second resistor (R2), and a second transistor (BJT2) having a collector connected electrically to the base of the first transistor (BJT1), a base connected electrically to the collector of the first transistor (BJT1), and an emitter adapted to be connected electrically to the second power source. In the present embodiment, the first power source is a positive power source, while the second power source is grounded.

FIG. 6 shows the relationship between another type of power-supply electrostatic discharge protection device (2D) and the non-wired pin (NW'''') of the integrated circuit package. The power-supply electrostatic discharge protection device (2D) of FIG. 6 includes a field device (FD) which has a drain connected electrically to one of the bonding pads (11D) that is adapted to be connected electrically to a first power source, a source adapted to be connected electrically to a second power source, and a gate connected electrically to the drain thereof. In the present embodiment, the first power source is a positive power source, while the second power source is grounded.

Figure 7:
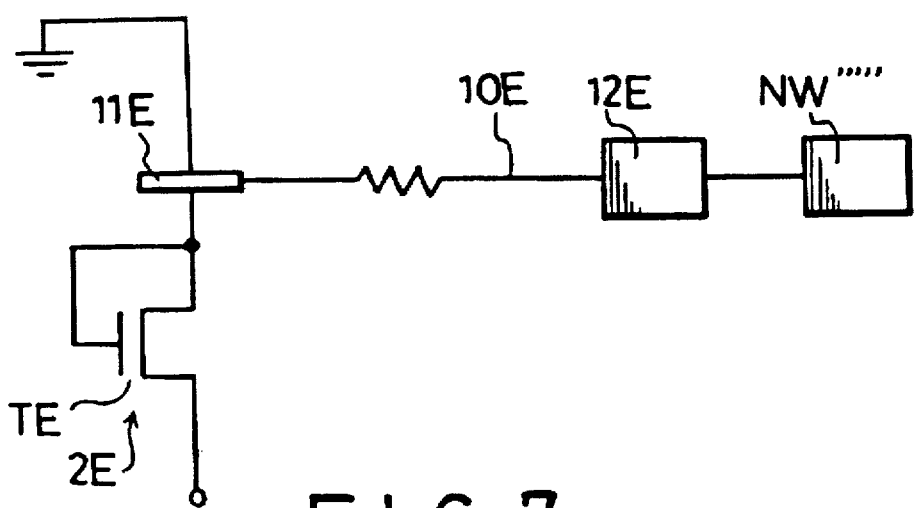
FIG. 7 is a schematic circuit diagram similar to FIG. 2, the integrated circuit package having a semiconductor chip which has a P-substrate.

Referring now to FIG. 7, the metal lead frame (12E) is connected electrically to one of the bonding pads (11E) which is adapted to be connected electrically to a first power source via the semiconductor chip (10E). It should be noted that, in the present embodiment, the semiconductor chip (10E) has a P-substrate with an inherent resistance of about 5Ω, and the first power source is grounded. A power-supply electrostatic-discharge protection device (2E) is connected electrically to said one of the bonding pads (11E) for discharging of current that results from electrostatic discharge stressing of the non-wired pin. The protection device (2E) includes a field effect transistor (TE) which has a drain connected electrically to said one of the bonding pads (11E), a source adapted to be connected electrically to a second power source and a gate connected electrically to the drain thereof. In the present embodiment, the second power source is a positive power source. Since the current that results from electrostatic discharge stressing of the non-wired pin (NW'''') is discharged through the protection device (2E), destruction of the adjacent wired pin (not shown) that is adjacent to the non-wired pin (NW'''') and that is caused by the ESD stressing to the non-wired pin (NW'''') is thus prevented.

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. A method for preventing electrostatic discharge failure in an integrated circuit package which includes a semiconductor chip, bonding pads on the semiconductor chip, a metal lead frame contacting electrically with the semiconductor chip, a plurality of wired pins wire-bonded respectively to the bonding pads, and at least one non-wired pin, the electrostatic discharge failure being due to electrostatic discharge stressing of the non-wired pin, said method comprising the step of:

wire-bonding the non-wired pin to the metal lead frame.

2. A method as claimed in claim 1, further comprising the step of connecting electrically a power-supply electrostatic-discharge protection device to the lead frame through the semiconductor chip for discharging of current that results from electrostatic discharge stressing of the non-wired pin.

3. A method as claimed in claim 1, further comprising the step of connecting electrically a power-supply electrostatic-discharge protection device to one of the bonding pads that is for connecting electrically to a first power source, said protection device including a field effect transistor which has a drain connected electrically to said one of the bonding pads, a source for connecting electrically to a second power source and a gate connected electrically to said source thereof.

4. A method as claimed in claim 3, wherein said first power source is a positive power source, while said second power source is grounded.

5. A method as claimed in claim 1, further comprising the step of connecting electrically a power-supply electrostatic-discharge protection device to one of the bonding pads that is for connecting electrically to a first power source, said protection device including a capacitor which has a first terminal connected electrically to said one of the bonding pads, and a second terminal for connecting electrically to a second power source.

6. A method as claimed in claim 5, wherein said first power source is a positive power source, while said second power source is grounded.

7. A method as claimed in claim 1, further comprising the step of connecting electrically a power-supply electrostatic-discharge protection device to one of the bonding pads that is for connecting electrically to a first power source, said protection device including a diode which has a cathode connected electrically to said one of the bonding pads, and anode for connecting electrically to a second power source.

8. A method as claimed in claim 7, wherein said first power source is a positive power source, while said second power source is grounded.

9. A method as claimed in claim 1, further comprising the step of connecting electrically a power-supply electrostatic-discharge protection device to one of the bonding pads that is for connecting electrically to a first power source, said protection device including a first transistor having an emitter connected electrically to said one of the bonding pads via a first resistor, and a collector for connecting electrically to a second power source via a second resistor, and a second transistor having a collector connected electrically to the base of the first transistor, a base connected electrically to the collector of the first transistor, and an emitter for connecting electrically to the second power source.

10. A method as claimed in claim 9, wherein said first power source is a positive power source, while said second power source is grounded.

11. A method as claimed in claim 1, further comprising the step of connecting electrically a power-supply electrostatic-discharge protection device to one of the bonding pads that is for connecting electrically to a first power source, said protection device including a field device which has a drain connected electrically to said one of the bonding pads, a source for connecting electrically to a second power source, and a gate connected electrically to the drain thereof.

12. A method as claimed in claim 11, wherein said first power source is a positive power source, while said second power source is grounded.

13. A method as claimed in claim 11, wherein said first power source is grounded, while said second power source is a positive power source.

* * * * *